United States Patent [19]

Schiller

[11] 4,318,889
[45] Mar. 9, 1982

[54] IMPERMEABLE COOLED CLOSING PLUG FOR PROCESSING TUBES, IN PARTICULAR IN SEMICONDUCTOR MANUFACTURE

[75] Inventor: Peter Schiller, Geissach, Fed. Rep. of Germany

[73] Assignee: Siemens Aktiengesellschaft, Berlin & Munich, Fed. Rep. of Germany

[21] Appl. No.: 204,540

[22] Filed: Nov. 6, 1980

[30] Foreign Application Priority Data

May 28, 1980 [DE] Fed. Rep. of Germany ....... 3020264

[51] Int. Cl.³ .................... F28D 21/00; B01T 19/02
[52] U.S. Cl. .................................. 422/203; 422/240; 422/245; 156/DIG. 83
[58] Field of Search .............. 156/613, 610, DIG. 83, 156/DIG. 73; 422/245, 240, 198, 203

[56] References Cited

U.S. PATENT DOCUMENTS

| 3,055,741 | 9/1962 | MacInnis et al. | 156/613 |
| 3,578,495 | 5/1971 | Pammer et al. | 156/613 |
| 4,162,293 | 7/1979 | Zeuch | 156/613 |

Primary Examiner—Hiram Bernstein
Attorney, Agent, or Firm—Hill, Van Santen, Steadman, Chiara & Simpson

[57] ABSTRACT

An impermeable cooled closing plug adapted for closing the end of a semiconductor manufacture processing tube is made of a material selected from the group consisting of quartz, silicon and silicon carbide, which materials have low heat conductivity and high chemical stability. The cooling effects of a cooling liquid supplied to the entrance flange of a processing tube are isolated from the tube closing plug by virtue of the low heat conductivity, thus preventing unwanted condensation effects at the entrance of the tube.

6 Claims, 1 Drawing Figure

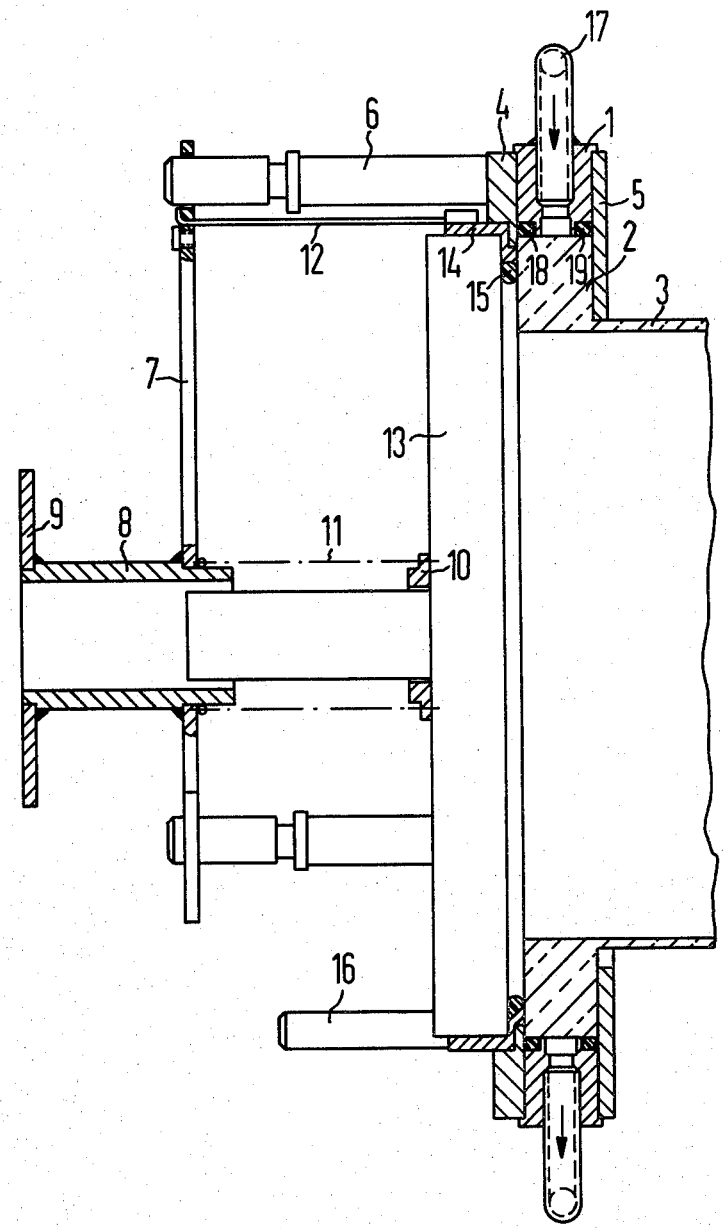

IMPERMEABLE COOLED CLOSING PLUG FOR PROCESSING TUBES, IN PARTICULAR IN SEMICONDUCTOR MANUFACTURE

BACKGROUND OF THE INVENTION

The invention concerns an impermeable cooled closing plug for processing tubes, in particular in semiconductor manufacture.

By processing tubes, tubes are to be understood in which for example an oxidation process takes place, a diffusion process is carried out, or a depositing process takes place. Also, tempering processes are undertaken in such tubes. These processing tubes are as a rule made of quartz and where required are closed with a cover.

The quartz tube of a known high pressure oxidation furnace is provided with a tube closing plug of steel. The tube closing plug serves the purpose of closing the quartz tube as tightly as possible, in order, among other things, to prevent the penetration of impurities from the surrounding environment into the interior of the tube, which environment is under higher pressure. For example, two Viton (a trademark of E. I. DuPont de Nemours Corp. for a type of synthetic rubber) O-rings serve as a seal. With higher temperatures, however, sealing rings of that sort have only very limited service life. It is thus necessary to cool them. If cooling is accomplished with water, and the tube closing plug consists of steel—a good heat conductor—it cannot be prevented that the cooling remains limited only to the direct vicinity of the sealing rings. This has the result that a large part of the tube closing plug surface is colder than a condensation point of the steam. In the case of damp oxidation, the steam which is present condenses on these cold points. This leads to the formation of droplets which run back into the quartz tube. They can penetrate into the operation zone where, for example, they can significantly interfere with the oxidation. For evaporation, they require heat which is drawn from the surrounding environment. This causes the temperature profile and thus also the oxide growth to become non-uniform.

The inner side of such a tube closing plug made of steel is strongly attacked by processing gases. Very quickly a thick iron oxide layer forms which must be regularly removed.

It can also not be avoided that water drops which form on the tube closing plug take up a part of the iron oxide, transport it into the tube, and there lead to contamination.

SUMMARY OF THE INVENTION

It is an object of the invention to create, with means which are as simple as possible, a tube closing plug for the air-tight closure of a processing tube which has gas flowing through it which is preferably heated. The closing plug must display a neutral behavior with respect to processing gases. This problem is solved such that a tube closing plug is provided which is made of a material with low heat conductivity and high chemical stability, for example of quartz. Also, silicon or silicon carbide can be employed. With a tube closing plug of this short, the disadvantages which were described are eliminated. Its behavior in processing gases is neutral and its heat conductivity is lower by a factor of ten then that of steel. Because of this low heat conductivity, the condensation is suppressed for the most part since the surface of the tube closing plug maintains a temperature which lies above the condensation point.

In the case of the previously known processing tubes, the cooling proceeded, for example, via a preset metal collar which was constantly connected with the tube and which represented a part of the processing chamber. According to a further development of the present invention, the metal part may be removed because corrosion and condensation can arise thereby. This removal occurs in the following manner. The cooling means, for example, water, is guided directly around the flange of the processing tube. In the case of a design of this sort, the metal collar is eliminated.

BRIEF DESCRIPTION OF THE DRAWING

The drawing illustrates in a cross-sectional view the cooled closing plug of the invention.

DESCRIPTION OF THE PREFERRED EMBODIMENTS

In the drawing FIGURE, a cooling body 1 is shown in the form of a ring, and which is positioned directly on a flange 2 of a processing tube 3. By means of plates 4 and 5, the cooling body is held fast on the flange of the tube. Reference numbers 6 through 12 show the parts of a locking device designated for the tube closing plug 13. Guide rods 6 connect to a locking support plate 7 controllable by thumb screw 8,9 connecting by shaft 10,11 to the plug 13. Reference number 14 designates a sealing ring holder and 15 an associated sealing ring. At the lower edge of the FIGURE, a supporting device 16 is indicated.

The cooling means supply pipe 17 is arranged on the cooling body 1. The supplying of the cooling means proceeds in the direction of the arrow. The cooling body is sealed with respect to the flange of the processing tube with two sealing rings 18,19.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An impermeable cooled closing plug system for semiconductor manufacture processing tubes, comprising: a processing tube with an entrance flange forming a flat abutment surface; a tube closing plug received on said entrance flange and adapted to plug the processing tube in air-tight fashion by use of a sealing ring between the plug and the abutment surface; and said closing plug being made of a material selected from the group consisting of quartz, silicon, and silicon carbide and having low heat conductivity and high chemical stability.

2. A plug system according to claim 1 wherein a cooling means is provided for directing a cooling liquid around the entrance flange of the processing tube and which provides cooling for the sealing ring.

3. A plug system according to claim 2 wherein the cooling means comprises water.

4. An impermeable cooled semiconductor manufacture closing plug system, comprising: a semiconductor manufacture processing tube; a tube closing plate dimensioned to plug the processing tube at an end of the tube; sealing means for providing an air tightclosure between the plug and the end of the tube; said closing plug being comprised of a quartz material with low heat conductivity and high chemical stability; and cooling means in communication with the sealing means so as to cool the same during processing.

5. A semiconductor manufacture processing tube system, comprising: a semiconductor manufacture processing tube means in which various processing steps of semiconductor manufacture directly occurs; a flange with an abutment surface at an end of the processing tube; cooling means for supplying a cooling liquid to the entrance flange of the processing tube; a tube closing plug comprised of one of the materials selected from the group of quartz, silicon, and silicon carbide, which is dimensioned to be received on the abutment surface to close off the end of the processing tube, and which is of low heat conductivity and high chemical stability; and locking means for maintaining the tube closing plug in position over the end of the processing tube.

6. The system of claim 5 wherein a synthetic rubber sealing ring is positioned between the flange and the closing plug which must be cooled by use of the cooling means during the manufacturing processing steps.

* * * * *